(12) United States Patent
Matsumoto

(10) Patent No.: US 7,345,935 B2
(45) Date of Patent: Mar. 18, 2008

(54) SEMICONDUCTOR WAFER AND METHOD FOR TESTING FERROELECTRIC MEMORY DEVICE

(75) Inventor: Akihito Matsumoto, Suwa (JP)

(73) Assignee: Seiko Epson Corporation (JP)

( * ) Notice: Subject to any disclaimer, the term of this patent is extended or adjusted under 35 U.S.C. 154(b) by 78 days.

(21) Appl. No.: 11/372,427

(22) Filed: Mar. 9, 2006

(65) Prior Publication Data

US 2006/0221735 A1 Oct. 5, 2006

(30) Foreign Application Priority Data

Apr. 1, 2005 (JP) ............................. 2005-106305

(51) Int. Cl.
*G11C 29/00* (2006.01)
(52) U.S. Cl. ..................... 365/201; 365/200; 365/145
(58) Field of Classification Search ................ 365/201, 365/200, 145, 150, 156, 185.23
See application file for complete search history.

(56) References Cited

U.S. PATENT DOCUMENTS

| | | | | |
|---|---|---|---|---|
| 5,910,911 A | * | 6/1999 | Sekiguchi et al. | 365/145 |
| 6,403,475 B1 | * | 6/2002 | Tanabe et al. | 438/663 |
| 6,426,904 B2 | * | 7/2002 | Barth et al. | 365/201 |
| 2006/0065917 A1 | * | 3/2006 | Kajita et al. | 257/295 |

FOREIGN PATENT DOCUMENTS

JP   09-082772   3/1997

* cited by examiner

*Primary Examiner*—Anh Phung
*Assistant Examiner*—Dang Nguyen
(74) *Attorney, Agent, or Firm*—Harness, Dickey & Pierce, P.L.C.

(57) ABSTRACT

A semiconductor wafer includes a plurality of semiconductor chip regions including ferroelectric memory devices, a test chip region, and a wiring that connects each of the plurality of semiconductor chip regions with the test chip region.

13 Claims, 9 Drawing Sheets

SEMICONDUCTOR WAFER AND METHOD FOR TESTING FERROELECTRIC MEMORY DEVICE

BACKGROUND

1. Technical Field

The present invention relates to semiconductor wafers and methods for testing ferroelectric memory devices.

2. Related Art

Generally, it takes a long time to conduct a reliability test on a semiconductor memory device with a large capacity. For example, when a polarization fatigue test (hereafter referred to as a "fatigue test") is conducted on a ferroelectric capacitor, the time required for the test on a memory cell of a 1-bit capacity is enormous. Therefore, for example, when a fatigue test is conducted on a ferroelectric memory device with a large capacity (for example, one mega bits or greater), a huge amount of time is required to complete the test.

In a process for manufacturing a semiconductor memory device, processings such as manufacture of a semiconductor wafer, probe test (hereafter referred to as a "P test"), manufacture of semiconductor chips by dicing the semiconductor wafer, packaging of the semiconductor chips, sorting test and reliability test are conducted in this order. In other words, the reliability test is generally conducted after dicing, packaging and other processings. Accordingly, testing cost (including P test and sorting test costs), dicing cost, and package assembling cost have already been incurred before the reliability test is conducted, such that, if any defects are found by the reliability test, the loss in the costs would become substantial, and it takes a long time to obtain the result of the reliability test after the semiconductor wafer has been manufactured. As a result, the cost for manufacturing semiconductor memory devices increases, and it takes a huge amount of time to feedback the reliability test result to the preceding steps.

Also, when a reliability test is conducted for a semiconductor wafer, the test is generally conducted on each of the chips (or 2-4 chips) in the wafer at a time in view of the structure of a probe card. For this reason, it would take a huge amount of time to conduct the reliability test on the entire semiconductor chips included in each semiconductor wafer, and thus the manufacturing cost increases. Moreover, accompanied with further miniaturization of semiconductor devices and an increase in the number of semiconductor chips per wafer by the use of a wafer with a large diameter in the future, there is a possibility that the manufacturing cost would further increase. An example of related art is described in Japanese Laid-open Patent Application JP-A-9-82772.

SUMMARY

In accordance with an advantage of some aspects of the present invention, there are provided a semiconductor wafer that can be manufactured with a lower manufacturing cost and a method for testing a ferroelectric memory device that can lower the manufacturing cost.

In accordance with an embodiment of the invention, a semiconductor wafer includes a plurality of semiconductor chip regions including ferroelectric memory devices, a test chip region, and a wiring that connects each of the plurality of semiconductor chip regions with the test chip region.

The term "connect" used in the embodiments of the invention means either "to physically connect" or "to electrically connect", or both of them.

The semiconductor wafer in accordance with the embodiment may include a plurality of semiconductor chip regions including ferroelectric memory devices, a test chip region, and wiring that connect the plurality of semiconductor chip regions with the test chip region. In the semiconductor wafer, a test control signal and a test pulse signal can be applied through the wirings from the test chip region to each of the plurality of semiconductor chip regions, whereby the ferroelectric memory devices included in the plurality of semiconductor chip regions can be tested almost simultaneously in a batch. As a result of this, a semiconductor wafer can be obtained with a reduced manufacturing cost.

It is noted here that, in the semiconductor wafer of the present embodiment, a test control signal and a test pulse signal can be applied through the wirings from the test chip region to the plurality of semiconductor chip regions. In this case, a power supply voltage and a ground potential can further be applied from the test chip region to the plurality of semiconductor chip regions through the wirings.

In the semiconductor wafer in accordance with an aspect of the embodiment, the wiring may be disposed in a scribe region.

In the semiconductor wafer in accordance with an aspect of the embodiment, the wiring may be composed of at least two or more layers.

The semiconductor wafer in accordance with an aspect of the embodiment may include a plurality of the test chip regions.

In the semiconductor wafer in accordance with an aspect of the embodiment, the ferroelectric memory device may include a plurality of memory cells for storing data, a plurality of word lines and a data line each connected to each of the plurality of memory cells, and a word line control circuit that controls the plurality of word lines. In this case, the ferroelectric memory device may further include a test selection circuit that receives the test control signal and the test pulse signal and turns on the entire word lines. Furthermore, in this case, the ferroelectric memory device may further include a test control signal input pad that receives the test control signal, and a first open potential fixing circuit connected between the test control signal input pad and the test selection circuit. Also, in this case, the ferroelectric memory device may further include a test pulse signal input pad that receives the test pulse signal, and a second open potential fixing circuit connected between the test pulse signal input pad and the test selection circuit.

In the semiconductor wafer in accordance with an aspect of the embodiment, the ferroelectric memory device may further include a plurality of plate lines each connected to each of the plurality of memory cells, wherein a signal to be inputted in the data line and a signal to be inputted in the plurality of plate lines may be complementary to each other.

A method for testing a ferroelectric memory device in accordance with an embodiment of the invention is applicable to a semiconductor wafer that includes a plurality of semiconductor chip regions including ferroelectric memory devices, a test chip region, and a wiring that connects each of the plurality of semiconductor chip regions with the test chip region, and the method includes the step of applying a test control signal and a test pulse signal from the test chip region to each of the plurality of semiconductor chip regions through the wiring.

According to the method for testing a ferroelectric memory device in accordance with an aspect of the present embodiment, the method may include the step of applying a test control signal and a test pulse signal from the test chip region to the plurality of semiconductor chip regions through wirings, whereby the ferroelectric memory devices included in the plurality of semiconductor chip regions can be tested almost simultaneously in a batch. Also, according to the method for testing a ferroelectric memory device in accordance with the present embodiment, the test on the ferroelectric memory devices is conducted with respect to the semiconductor wafer that includes the plurality of semiconductor chip regions, such that test results can be obtained at an earlier stage during the process of manufacturing semiconductor chips. As a result of this, the manufacturing cost can be lowered.

The method for testing a ferroelectric memory device in accordance with an aspect of the present embodiment may further include the step of applying a power supply voltage and a ground potential from the test chip region to the plurality of semiconductor chip regions through the wirings.

In the method for testing a ferroelectric memory device in accordance with an aspect of the present embodiment, the ferroelectric memory device may include a plurality of memory cells for storing data, and a plurality of word lines and a data line each connected to each of the plurality of memory cells, and the method may further include a test selection step of turning on all of the plurality of word lines based on the test control signal and the test pulse signal received.

In the method for testing a ferroelectric memory device in accordance with an aspect of the present embodiment, the ferroelectric memory device may further include a plurality of plate lines each connected to each of the plurality of memory cells, and the method may further include the step of inputting a signal, which is complementary to a signal to be inputted in the data line, in the plurality of plate lines.

DESCRIPTION OF EXEMPLARY EMBODIMENTS

Preferred embodiments of the invention are described below with reference to the accompanying drawings.

1. Semiconductor Wafer

Figure 1:
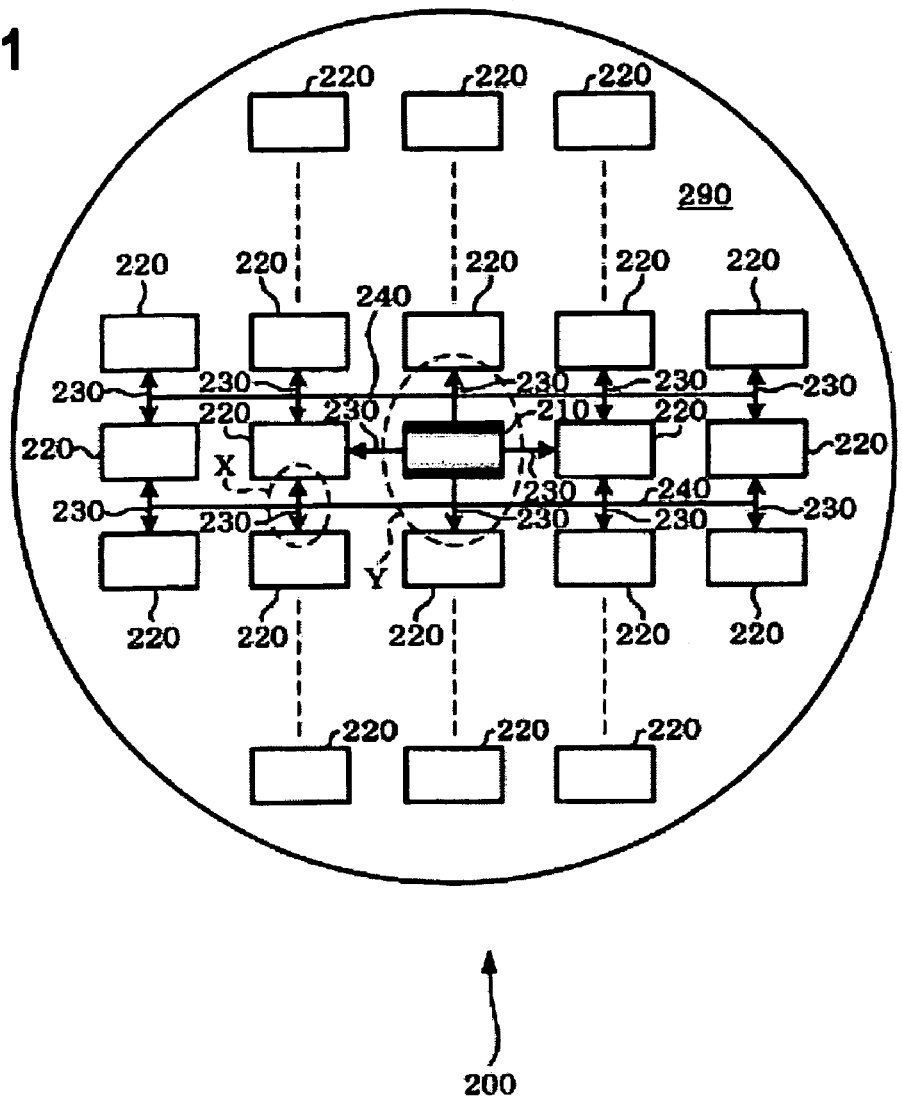
FIG. 1 is a plan view schematically showing a semiconductor wafer in accordance with an embodiment of the invention.
Figure 2:
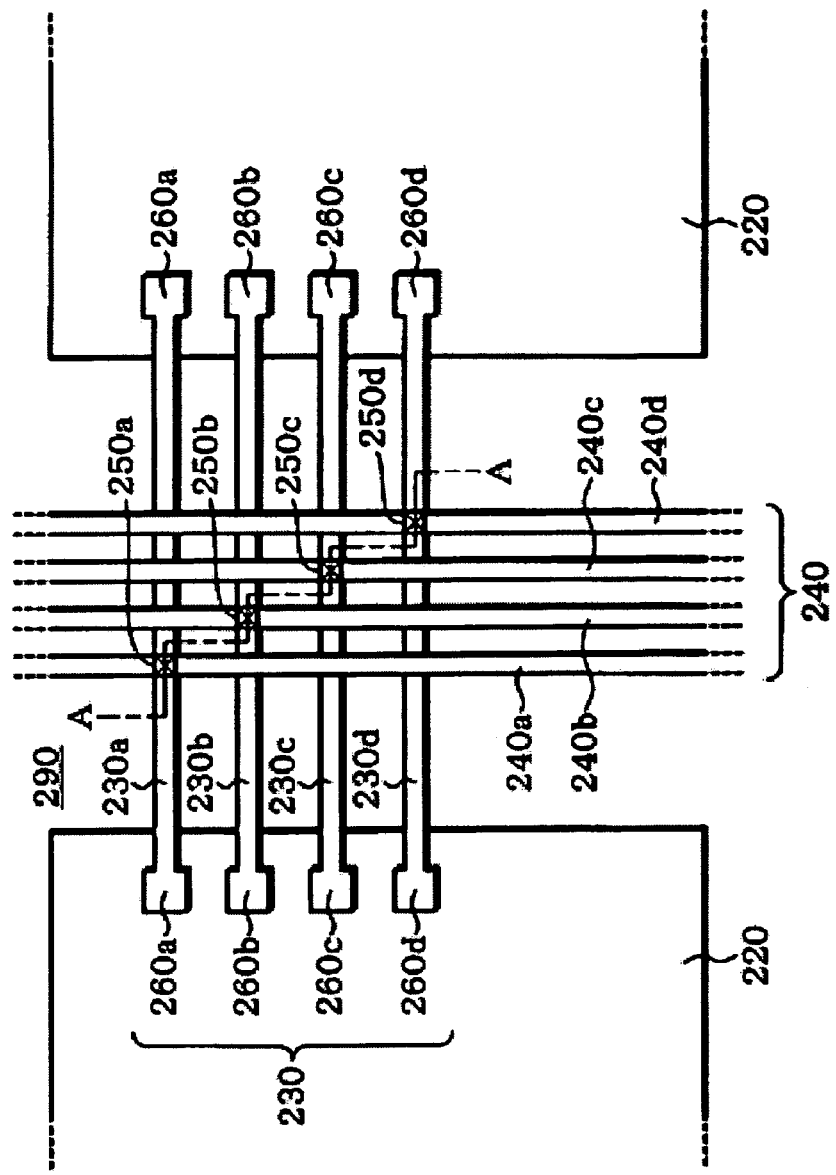
FIG. 2 is an enlarged plan view schematically showing a region X indicated in FIG. 1.
Figure 3:
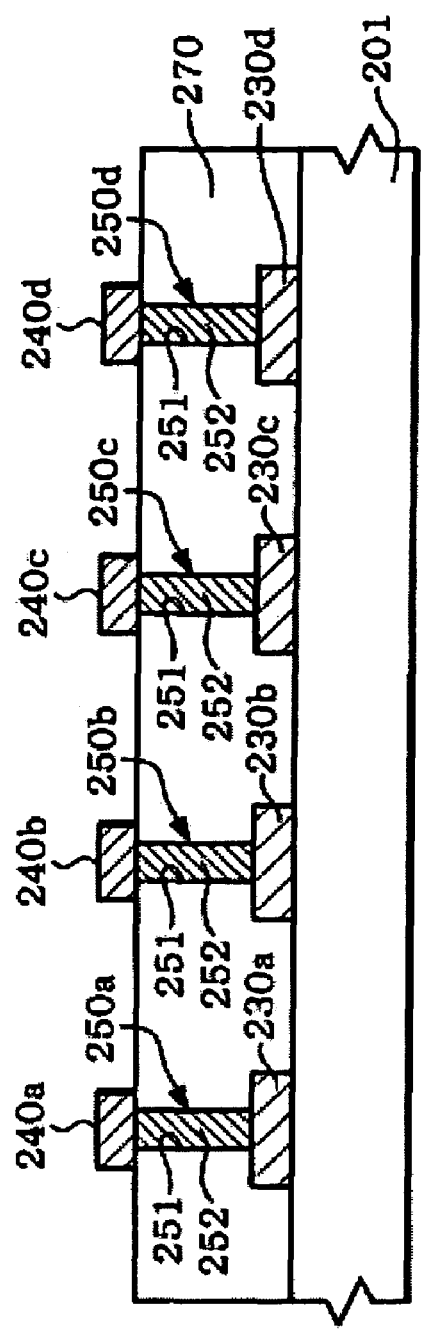
FIG. 3 is a view schematically showing a cross section taken along a line A-A indicated in FIG. 2.
Figure 4:
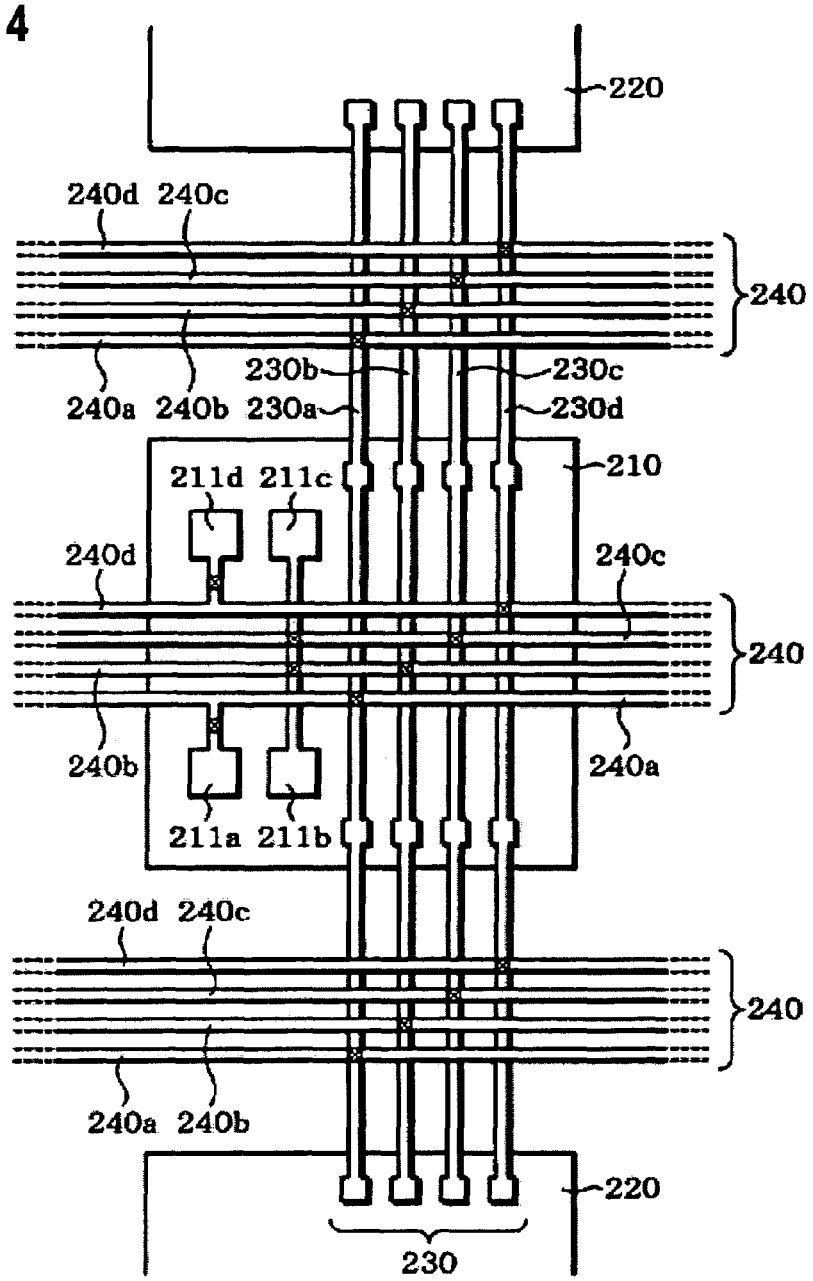
FIG. 4 is an enlarged plan view schematically showing a region Y indicated in FIG. 1.

FIG. 1 is a plan view schematically showing a semiconductor wafer 200 in accordance with an embodiment of the invention. FIG. 2 is an enlarged plan view schematically showing a region X indicated in FIG. 1. FIG. 3 is a view schematically showing a cross section taken along a line A-A indicated in FIG. 2. FIG. 4 is an enlarged plan view schematically showing a region Y indicated in FIG. 1.

The semiconductor wafer 200 of the present embodiment includes a plurality of semiconductor chip regions 220, a test chip region 210 for testing, and wirings 230 and 240. The present embodiment shows an example in which a single test chip region 210 is provided generally at the center of the semiconductor wafer. Each of the semiconductor chip regions 220 includes a ferroelectric memory device 100 (see FIG. 6). The wirings 230 and 240 connect the plurality of semiconductor chip regions 220 with the test chip region 210.

A power supply voltage (Vdd), a ground potential (GND), a test control signal and a test pulse signal are applied from the test chip region 210 to the plurality of semiconductor chip regions 220 through the wirings 230 and 240. In the semiconductor wafer 200 of the present embodiment, as shown in FIG. 1 and FIG. 2, the wirings 230 and 240 can be disposed in scribe regions 290 of the semiconductor wafer 200. The scribe regions 290 are cut when the semiconductor chip regions 220 are separated by dicing into individual semiconductor chips.

In the present embodiment, as shown in FIG. 2, the wirings 230 may include wirings 230a, 230b, 230c and 230d, and the wirings 240 may include wirings 240a, 240b, 240c and 240d. The power supply voltage (Vdd) is applied from the test chip region 210 to the plurality of semiconductor chip regions 220 through the wirings 230a and 240a, the ground potential (GND) through the wirings 230b and 240b, the test control signal through the wirings 230c and 240c, and the test pulse signal through the wirings 230d and 240d. In other words, the power supply voltage (Vdd), the ground potential (GND), the test control signal and the test pulse signal are applied generally at the same time from the test chip region 210 to the plurality of semiconductor chip regions 220 in a batch.

The present embodiment is described as to a case where the test conducted on the ferroelectric memory device 100 is a long-term reliability test (fatigue test). For example, when a fatigue test is conducted on the ferroelectric memory device 100, pulse signals whose potential changes from 0V to Vdd to 0V to −Vdd to 0V to Vdd to 0V to −Vdd and the like are repeatedly applied as a test pulse signal to a ferroelectric capacitor 116 (see FIG. 6) contained in the ferroelectric memory device 100.

Also, in the present embodiment, as shown in FIG. 3, the wirings 230 and 240 may be formed with at least two or more layers. More specifically, the wirings 230 may be wirings in a lower layer below the wirings 240, in other words, the wirings 240 may be wirings in an upper layer above the wirings 230. As shown in FIG. 2 through FIG. 4, the wirings 230a, 230b, 230c and 230d are electrically connected to the wirings 240a, 240b, 240c and 240d, respectively, through contact sections 250a, 250b, 250c and 250d, respectively. The contact sections 250a, 250b, 250c and 250d may be mainly formed with contact holes 251 provided in an insulation layer 270 and conductive layers 252 disposed in the contact holes 251, respectively.

Figure 9:
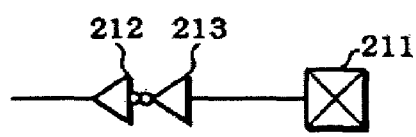
FIG. 9 shows a diagram showing an exemplary structure of a circuit included in a test chip region shown in FIG. 1.

The test chip region 210 (see FIG. 4) includes pads and a buffer circuit. FIG. 9 shows an example of the structure of the circuit included in the test chip region 210. The test chip region 210 includes input pads 211 (211a, 211b, 211c and 211d), and inverters 212 and 213 (for example, CMOS inverters). More specifically, as shown in FIG. 9, the inverters 212 and 213 are connected to each of the input pads 211a, 211b, 211c and 211d. In the circuit shown in FIG. 9, the inverter 213 is connected to the input pad 211. The inverter 212 has one end connected to the inverter 213 and another end connected to the wiring 240 (FIG. 4).

In the present embodiment, as shown in FIG. 4, the pad 211a is a pad for Vdd, and connected to the wirings 230a and 240a. The pad 211b is a pad for GND, and connected to the wirings 230b and 240b. The pad 211c is a test control signal input pad, and connected to the wirings 230c and 240c. The pad 211d is a test pulse signal input pad, and connected to the wirings 230d and 240d. When a fatigue test is conducted, probes of a tester (not shown) are placed on the pads 211a, 211b, 211c and 211d.

Figure 6:
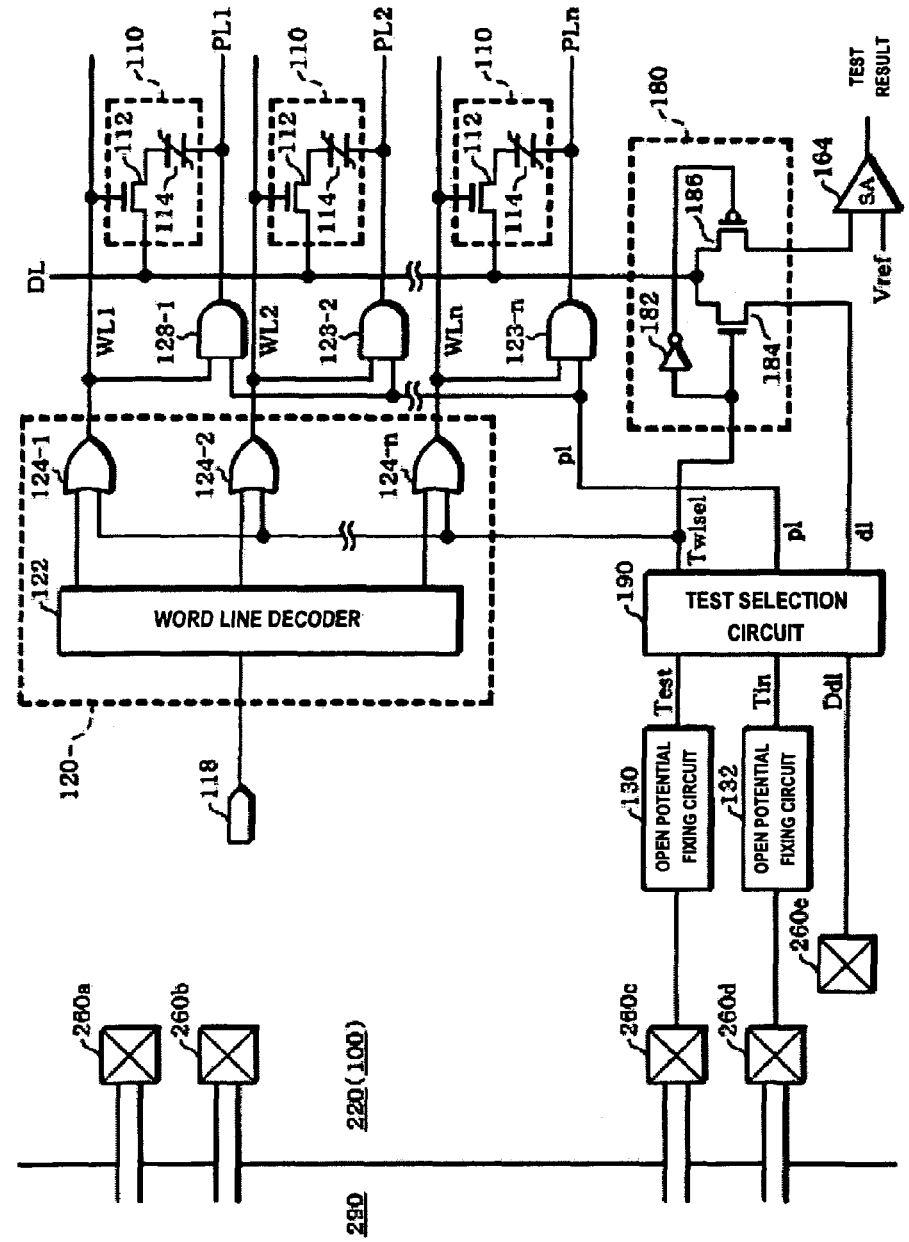
FIG. 6 is a diagram showing an exemplary structure of a ferroelectric memory device shown in FIG. 1.

Also, as described above, each of the semiconductor chip regions 220 includes a ferroelectric memory device 100 (see FIG. 6). The ferroelectric memory device 100 includes a plurality of memory cells 110 for storing data, a plurality of word lines WL (WL1, WL2, ... WLn) and a data line DL each connected to each of the plurality of memory cells 110, and a word line control circuit 122 that controls the plurality of word lines. Also, the ferroelectric memory device 100 may include a test selection circuit 190, a sense amplifier 164, and a switching section 180. Moreover, the ferroelectric memory device 100 may further include, as shown in FIG. 6, a pad 260a for Vdd in which a power supply voltage is inputted, a pad 260b for a ground line in which a ground potential is inputted, a test control signal input pad 260c that receives a test control signal, and a test pulse signal input pad 260d that receives a test pulse signal.

The memory cell 110 includes an n-type MOS transistor 112 and a ferroelectric capacitor 114. The n-type MOS transistor 112 has a source and a drain, one of which is connected to the data line DL, and the other connected to one end of the ferroelectric capacitor 114. Also, the n-type MOS transistor 112 has a gate connected to the word line WL. The n-type MOS transistor 112 controls, based on the potential on the word line WL, as to whether the data line DL is be connected to one end of the ferroelectric capacitor 114.

Figure 5:
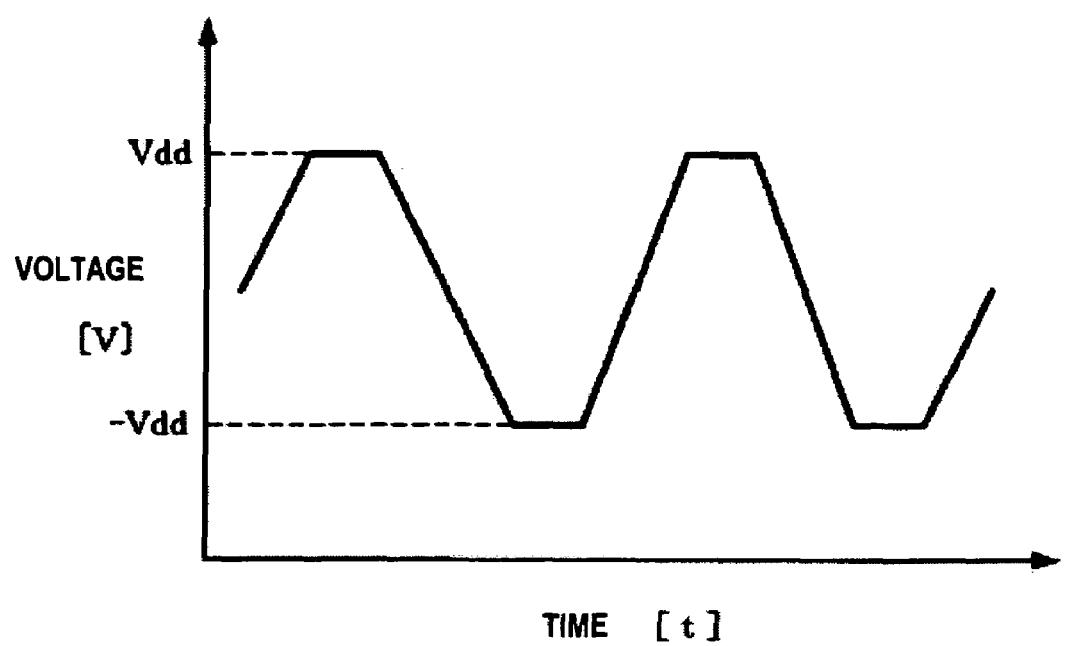
FIG. 5 is a graph showing an example of a fatigue pulse that is applied to a memory cell.

Also, the ferroelectric memory device 100 further includes a plurality of plate lines PL (PL1, PL2, ... PLn) each connected to each of the plurality of memory cells 110. The plate line PL is connected to the other end of the ferroelectric capacitor 114. By generating a potential difference between one end of the ferroelectric capacitor 114 and the other end thereof (in other words, between the data line DL and the plate line PL), a predetermined polarization is generated in the ferroelectric capacitor 114. As a result of this, predetermined data is written in the memory cell 110. In the present embodiment, when a fatigue test is conducted on the ferroelectric memory device 100, a pulse signal shown in FIG. 5 can be continuously applied to the ferroelectric capacitor 114.

Figure 11:
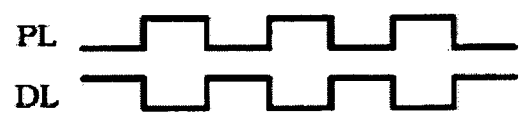
FIG. 11 is a view showing an example of complementary pulses that are applied to a plate line and a data line.

In the present embodiment, the signal that is inputted in the data line DL and the signal that is inputted in the plurality of plate lines PL can be complementary to each other (see FIG. 11). As a result, the number of input pulse lines can be reduced.

The word line control circuit 120 controls in selecting one of the plurality of word lines WL1-n (n is a positive integer). In other words, the word line control circuit 120 changes the potential on a selected one of the plurality of word lines WL1-n to turn on the word line WL, thereby selecting the word line WL.

The word line control circuit 120 includes a word line decoder 122 and a plurality of OR circuits 124-1 through 124-n which is an example of a selection circuit. The word line decoder 122 receives as an input an address signal generated by an address signal generation circuit 118, and changes the logical value of a signal to be given to an input of each of the OR circuits 124-1 through 124-n based on the address signal.

The OR circuits 124-1 through 124-n turn on a portion or all of the word lines WL1-n based on outputs of the word line decoder 122 and an output of the test selection circuit 190. More concretely, when the test selection circuit 190 gives a signal at logical L, the OR circuits 124-1 through 124-n set, based on outputs of the word line decoder 122, those of the word lines WL to be selected to a high potential, and set the other word lines WL at a low potential. In other words, in accordance with the present embodiment, the OR circuits 124-1 through 124-n also function as word line drivers. It is noted here that the high potential means to be a potential at which the n-type MOS transistor 112 composing the memory cell 110 turns on, and the low potential means to be a potential at which the n-type MOS transistor 112 turns off.

The ferroelectric memory device 100 may further include AND circuits 123-1 through 123-n. The AND circuit 123-1 through 123-n turn on the plate lines PL1-n based on outputs of the OR circuits 124-1 through 124-n and an output pl. To apply the fatigue pulse shown in FIG. 5 to the ferroelectric capacitors 114, for example, the gates of the n-type MOS transistors 112 connected to the word lines WL1-n are turned on, the output pl is applied to the ferroelectric capacitors 114, and a signal (output pl) that is complementary to the output dl is applied to the plate lines PL1-n, thereby generating a potential difference in each of the ferroelectric capacitors 114.

The test selection circuit 190 receives a test control signal and a test pulse signal, as shown in FIG. 6, and is capable of turning on all of the plurality of word lines WL1-n based on the test control signal and the test pulse signal. In other words, the test selection circuit 190 is capable of turning on all of the ferroelectric memory cells 110 coupled to the plurality of word lines WL1-n. Therefore, according to this structure, a reliability test can be conducted on a plurality of memory cells at once, such that the time required for the reliability test can be shortened.

Figure 7:
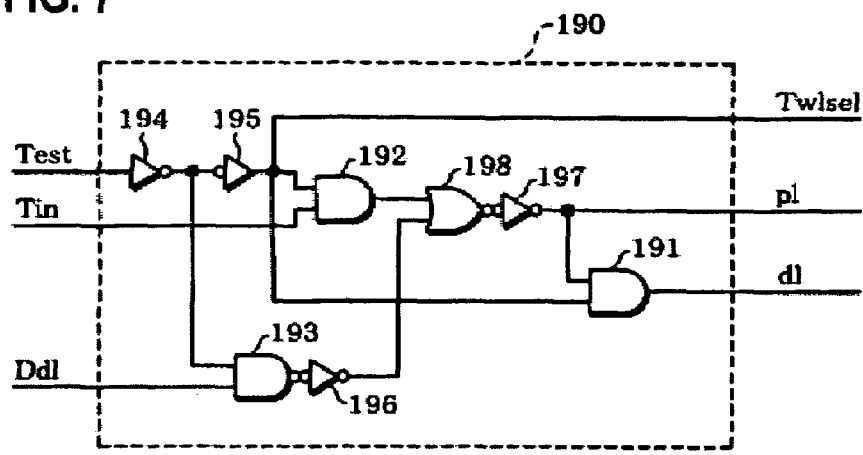
FIG. 7 is a diagram showing an exemplary structure of a test selection circuit shown in FIG. 6.

FIG. 7 shows an exemplary structure of the test selection circuit 190 shown in FIG. 6. The test selection circuit 190 includes inverters 194, 195, 196 and 197, AND circuits 191, 192 and 193, and an OR circuit 198. When the test control signal (Test) inputted through the test control signal input pad 260c is at logical H, the test selection circuit 190 sets a "test mode" wherein the test pulse signal (Tin) inputted through the test pulse signal input pad 260d is outputted as an output dl to the data line DL and an output pl to the plate line PL. On the other hand, when the test control signal (Test) inputted through the test control signal input pad 260c is at logical L, a potential Ddl inputted through a product input pad 260e is outputted to the data line DL and the plate line PL.

More concretely, when the test selection circuit 190 selects the "test mode," an output Twlsel of the test selection circuit 190 becomes to be logical H, the output dl becomes to be the same as the test pulse signal (Tin), and the output pl becomes to be /Tin, whereby these signals are applied to the plate lines PL1-n and the data line DL. In this case, by setting the output Twlsel to logical H, the word lines WL (WL1-n) are compulsorily set to H logical, whereby all of the n-type MOS transistors 112 coupled to the word lines WL are turned on, and the output dl is applied to the ferroelectric capacitors 114. As a result, the test pulse signal (Tin) is simultaneously applied to the ferroelectric capacitors 114 connected to the data line DL. Also, by setting the word lines WL to H logical, the output pl that is complementary to the output dl is applied to the plate lines PL1–n. As a result, the test signal (/Tin) is simultaneously applied to the plurality of ferroelectric capacitors 114 connected to the plate lines PL (PL1–n).

First and second open potential fixing circuits 130 and 132 may be provided between the test control signal input pad 260c and the test selection circuit 190 and between the test pulse signal input pad 260d and the test selection circuit 190, respectively. Because the open potential fixing circuits 130 and 132 are provided, malfunction of the circuit within the ferroelectric memory device 100 can be prevented when the semiconductor wafer 200 is diced and the scribe regions 290 are cut and the wirings 230 and 240 are thus removed or short-circuited.

Figure 8:
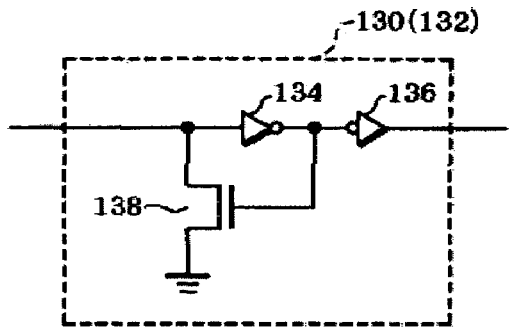
FIG. 8 is a diagram showing an exemplary structure of an open potential fixing circuit shown in FIG. 6.

FIG. 8 shows an exemplary structure of the open potential fixing circuit 130 and 132 shown in FIG. 6. The open potential fixing circuit 130 and 132 includes inverters 134 and 136, and an h-type MOS transistor 138. When an input is open, the open potential fixing circuit 130 and 132 compulsorily fixes its output to L logical. Accordingly, when the ferroelectric memory device 100 is operated after the semiconductor chip regions 220 have been diced into individual pieces, packaged and completed as products, malfunction such as selection of all the addresses by malfunction of the test selection circuit 190 can be prevented.

One end of the open potential fixing circuit 130 (or 132) is connected to the input pad 260c (or the input pad 260d), and an output from the input pad 260c (or 260d) is connected to an input of the inverter 134 and a drain of the n-type MOS transistor 138.

The inverter 134 has an output connected to an input of the inverter 136 and to a gate of the n-type MOS transistor 138, and the inverter 138 has an output connected to an input of the test selection circuit 190. Further, a source of the n-type MOS transistor 138 is grounded.

The switching section 180 includes an inverter 182, an n-type MOS transistor 184 and a p-type MOS transistor 186, and selects, based on the output (Twlsel) from the test selection circuit 190, to connect a specified one of the data lines DL to either the output (dl) of the test selection circuit 190 or one of the inputs of the sense amplifier 164.

The n-type MOS transistor 184 has a source and a drain, one of which is connected to the data line DL, and the other connected to the output (dl) of the test selection circuit 190. The p-type MOS transistor 186 has a source and a drain, one of which is connected to the data line DL, and the other connected to one of the inputs of the sense amplifier 164.

A reference voltage Vref is supplied to the other input of the sense amplifier 164, whereby the sense amplifier 164 compares the potential on the data line DL with the reference voltage Vref, thereby judging data written in the memory cell 110, and outputting a judging result.

The semiconductor wafer 200 in accordance with the present embodiment includes a plurality of semiconductor chip regions 220 including ferroelectric memory devices 100, a test chip region 210 and wirings 230 and 240 that connect the test chip region 210 and the plurality of semiconductor chip regions 220. In the semiconductor wafer 200, by applying a test control signal and a test pulse signal from the test chip region 210 to the plurality of semiconductor chip regions 220 through the wirings 230 and 240, the ferroelectric memory devices 100 included in the plurality of semiconductor chip regions 220 can be tested generally at the same time in a batch. In other words, in the state before the semiconductor chip regions 220 are diced into individual semiconductor chips, the ferroelectric memory devices 100 included in the plurality of semiconductor chip regions 220 can be tested generally simultaneously in a batch. As a result of this, the semiconductor wafer 200 can be obtained at a reduced manufacturing cost.

2. Method for Testing Ferroelectric Memory Device

Figure 12:
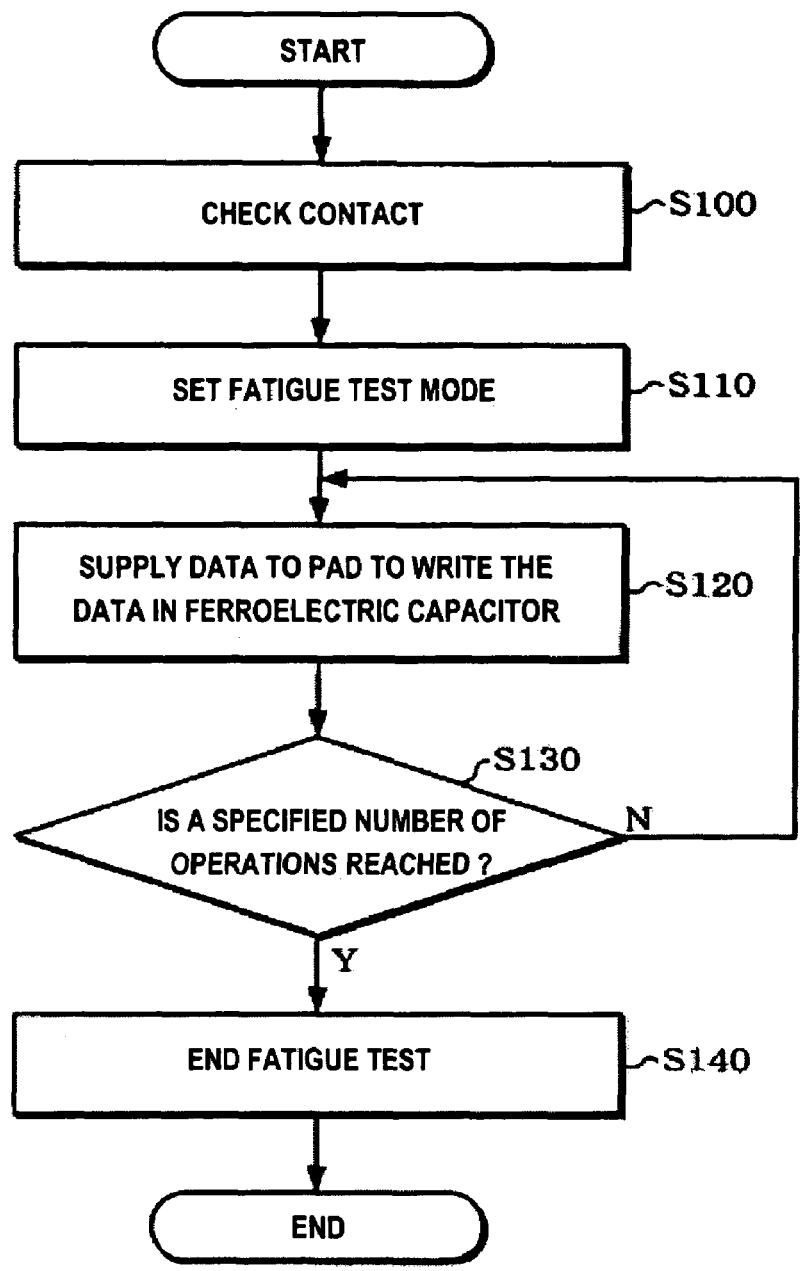
FIG. 12 is a flow chart indicating operations of a ferroelectric memory device shown in FIG. 6.

FIG. 12 is a flowchart of operations of the ferroelectric memory device 100 in accordance with an embodiment of the invention. Referring to FIG; 1 through FIG. 11, a test method of the fatigue test for the ferroelectric memory device 100 in accordance with the present embodiment is described.

First, probes of a test apparatus (not shown) for testing the ferroelectric memory device 100 are brought in contact with the pads 211a, 211b, 211c and 211d (see FIG. 4) of the test chip region 210, thereby conducting a contact check (S100). Next, after confirming connection of the test apparatus with the pads 211a, 211b, 211c and 211d, the ferroelectric memory devices 100 included in the plurality of semiconductor chip regions 220 are set in a fatigue test mode (S110). More concretely, the logical value of the test control signal that is supplied from the test apparatus through the pad 211c of the test chip region 210 and the wirings 230c and 240c to the pad 260c of the semiconductor chip region 220 is set to logical H, such that the test selection circuit 190 supplies logical H to the inputs of the OR circuits 124-1 through 124-n. It is noted that, in the present embodiment, setting the fatigue test mode means to set the logical value of the test control signal to be supplied to the pad 260c of the semiconductor chip region 220 to logical H.

Consequently, the potential on the word lines WL1–n connected to the outputs of the OR circuits 124-1 through 124-n are set to a high potential, such that the n-type MOS transistors 112 composing the memory cells 110 connected to the word lines WL1–n turn on. In other words, in step S110, the logical value of the test control signal to be supplied from the test apparatus to the pad 260c is set to logical H, whereby the ferroelectric capacitors 114 included in all of those of the memory cells 110 connected to the word lines WL1–n are connected to corresponding ones of the data lines DL.

Next, while the plurality of word lines WL1–n are turned on, predetermined data is written in the ferroelectric capacitors 114 (S120). More concretely, a test pulse signal is supplied from the test apparatus through the pad 211d of the test chip region 210 and the wirings 230d and 240d to the pad 260d of the semiconductor chip region 220, such that the test selection circuit 190 cyclically changes the potential on the data line DL between a high potential (for example, Vdd) and a low potential (for example, 0V), whereby the predetermined data is written in the ferroelectric capacitors 114 multiple times.

At this time, the potential on the plurality of plate lines PL1–n may be set to a high potential (for example, Vdd), and the voltage to be applied to the ferroelectric capacitors 114 may be alternately changed to 0V or −Vdd with the potential on the plate lines PL1–n as a reference, thereby writing data "1" in the ferroelectric capacitors 114 multiple times. Alternatively, the potential on the plurality of plate lines PL1–n may be set to a low potential (for example, 0V), and the voltage to be applied to the ferroelectric capacitors 114 may be alternately changed to 0V or Vdd with the potential on the plate lines PL1–n as a reference, thereby writing data "0" in the ferroelectric capacitors 114 multiple times. Alternatively, the potential on the plurality of plate lines PL1-n may be alternately changed to a high potential or to a low potential, thereby alternately writing data "1" or data "0" in the ferroelectric capacitors 114.

Next, data is written in the ferroelectric capacitors 114 (No at S130) until the number of incidences of writing data in the ferroelectric capacitors 114 reaches a predetermined number. When the number of incidences of writing data in the ferroelectric capacitors 114 reaches a predetermined number (S130, Yes), the logical value of the test control signal to be supplied to the pad 260c of the semiconductor chip region 220 is set to logical L, whereby the fatigue test is completed (S140).

The method for testing a ferroelectric memory device 100 in accordance with the present embodiment is applied to the semiconductor wafer 200 that includes the plurality of semiconductor chip regions 220 including ferroelectric memory devices 100, the test chip region 210, and the wirings 230 and 240 that connect the plurality of semiconductor chip regions 220 with the test chip region 210, and the method includes the steps of applying, from the test chip region 210 to the plurality of semiconductor chip regions 220, a test control signal through the wirings 230c and 240c, and a test pulse signal through the wirings 230d and 240d, whereby the ferroelectric memory devices 100 included in the plurality of semiconductor chip regions 220 can be tested generally at the same time in a batch. In other words, in the state before the semiconductor chip regions 220 are diced into individual semiconductor chips, the ferroelectric memory devices 100 included in the plurality of semiconductor chip regions 220 can be tested generally at the same time in a batch. Therefore test results can be obtained at an earlier stage during the process of manufacturing semiconductor chips. As a result of this, the manufacturing cost can be lowered.

3. Modified Example

Figure 10:
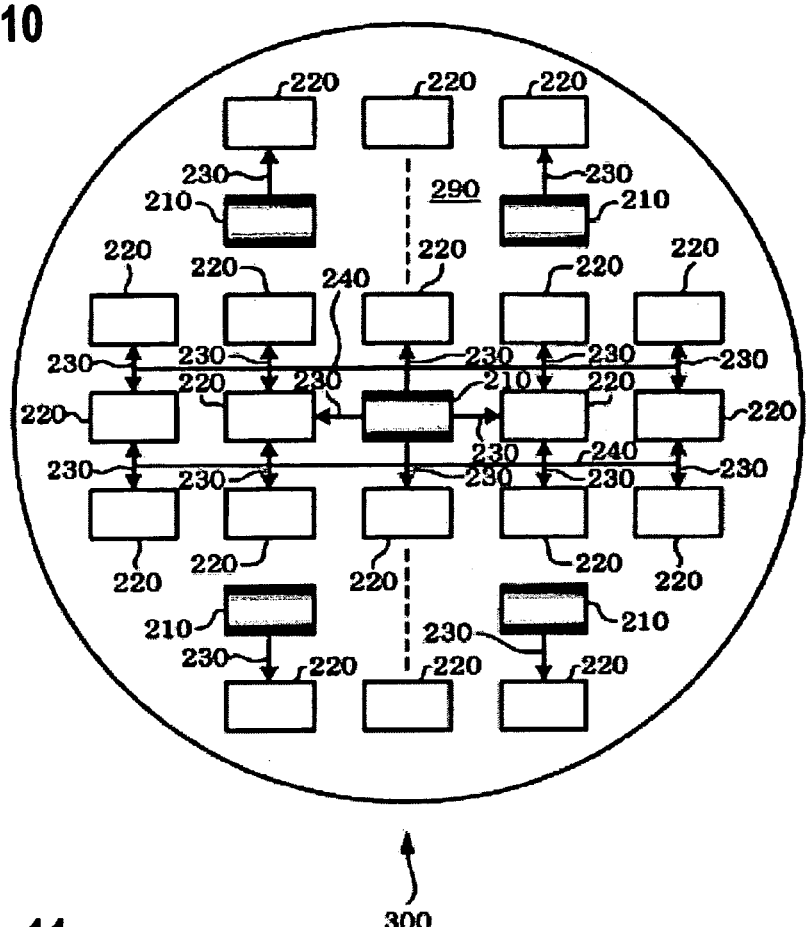
FIG. 10 is a plan view schematically showing a modified example of the semiconductor wafer shown in FIG. 1.

FIG. 10 is a plan view schematically showing a modification example (semiconductor wafer 300) of the semiconductor wafer 200 shown in FIG. 1. The semiconductor wafer 300 includes a plurality of test chip regions 210. Each of the test chip regions 210 is connected to a plurality of semiconductor chip regions 220 through wirings 230 and 240. It is noted that, in FIG. 10, illustration of a portion of the wirings 230 and the wirings 240 is omitted for the test chip regions 210 disposed in a left upper section, a left lower section, a right upper section and a right lower section of the semiconductor wafer 300. However, like the test chip region 21Q disposed at the center of the semiconductor wafer 300, wirings 230 and 240 that connect each of the test chip regions 210 with a plurality of semiconductor chip regions 220 are provided for the other test chip regions 210 disposed in the abovementioned sections.

In FIG. 10, the semiconductor wafer 300 includes five test chip regions 210, wherein the test chip regions 210 are disposed at the center, in the left upper section, in the left lower section, in the right upper section and in the right lower section of the semiconductor wafer 300, respectively, but the number and locations of the test chip regions 210 are not limited to the above. In particular, when a semiconductor wafer has a large diameter, a plurality of test chip regions 210 may be provided, whereby a voltage reduction by the resistance of the wirings 230 and 240 can be prevented.

The embodiments of the invention are described above in detail. However, those skilled in the art should readily understand that many modifications can be made without substantially departing from the novel matter and effects of the invention. Accordingly, those modified examples are also included in the scope of the invention.

What is claimed is:

1. A semiconductor wafer comprising:
    a plurality of semiconductor chip regions including ferroelectric memory devices;
    a test chip region; and
    a wiring that connects each of the plurality of semiconductor chip regions with the test chip region,
    wherein the ferroelectric memory device includes a plurality of memory cells for storing data, a plurality of word lines and a data line each connected to each of the plurality of memory cells, a word line control circuit that controls the plurality of word lines, and a test selection circuit that receives a test control signal and a test pulse signal and turns on all of the plurality of word lines.

2. A semiconductor wafer according to claim 1, wherein the test control signal and the test pulse signal are applied through the wiring from the test chip region to each of the plurality of semiconductor chip regions.

3. A semiconductor wafer according to claim 2, wherein a power supply voltage and a ground potential are further applied from the test chip region to each of the plurality of semiconductor chip regions through the wiring.

4. A semiconductor wafer according to claim 1, wherein the wiring is disposed in a scribe region.

5. A semiconductor wafer according to claim 1, wherein the wiring is formed from at least two layers.

6. A semiconductor wafer according to claim 1, comprising a plurality of the test chip regions.

7. A semiconductor wafer according to claim 1, wherein the ferroelectric memory device further includes a test control signal input pad that receives the test control signal, and a first open potential fixing circuit connected between the test control signal input pad and the test selection circuit.

8. A semiconductor wafer according to claim 1, wherein the ferroelectric memory device further includes a test pulse signal input pad that receives the test pulse signal, and a second open potential fixing circuit connected between the test pulse signal input pad and the test selection circuit.

9. A semiconductor wafer according to claim 1, wherein the ferroelectric memory device further includes a plurality of plate lines each connected to each of the plurality of memory cells, wherein a signal to be inputted in the data line and a signal to be inputted in the plurality of plate lines are complementary to each other.

10. A method for testing a ferroelectric memory device in a semiconductor wafer that includes a plurality of semiconductor chip regions including ferroelectric memory devices, a test chip region, and a wiring that connects each of the plurality of semiconductor chip regions with the test chip region, the method comprising applying a test control signal and a test pulse signal from the test chip region to each of the plurality of semiconductor chip regions through the wiring and a test selection step of turning on all of the plurality of word lines based on the test control signal and the test pulse signal received.

11. A method for testing a ferroelectric memory device according to claim 10, further comprising applying a power supply voltage and a ground potential from the test chip region to each of the plurality of semiconductor chip regions through the wiring.

12. A method for testing a ferroelectric memory device according to claim 11, wherein the ferroelectric memory device includes a plurality of memory cells for storing data, and a plurality of word lines and a data line each connected to each of the plurality of memory cells, the method further comprising a test selection step of turning on the plurality of word lines.

13. A method for testing a ferroelectric memory device according to claim 10, wherein the ferroelectric memory device further includes a plurality of plate lines each connected to each of the plurality of memory cells, the method further comprising inputting a signal that is complementary to a signal to be inputted in the data line in the plurality of plate lines.

* * * * *